United States Patent
Chen et al.

(10) Patent No.: US 10,795,264 B2
(45) Date of Patent: *Oct. 6, 2020

(54) LIGHT SOURCE FOR LITHOGRAPHY EXPOSURE PROCESS

(71) Applicant: Taiwan Semiconductor Manufacturing Co., Ltd., Hsinchu (TW)

(72) Inventors: Hsin-Feng Chen, Yilan (TW); Han-Lung Chang, Kaohsiung (TW); Li-Jui Chen, Hsinchu (TW); Bo-Tsun Liu, Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/715,808

(22) Filed: Dec. 16, 2019

(65) Prior Publication Data

US 2020/0142318 A1    May 7, 2020

Related U.S. Application Data

(63) Continuation of application No. 16/449,645, filed on Jun. 24, 2019, now Pat. No. 10,509,324, which is a
(Continued)

(51) Int. Cl.
*G03F 7/20* (2006.01)
*H05G 2/00* (2006.01)

(52) U.S. Cl.
CPC ...... *G03F 7/70033* (2013.01); *G03F 7/70008* (2013.01); *H05G 2/006* (2013.01)

(58) Field of Classification Search
CPC ............ G03F 7/70033; G03F 7/70883; G03F 7/70908; G03F 7/70916; H05G 2/00–008
(Continued)

(56) References Cited

U.S. PATENT DOCUMENTS 8,764,995 B2    7/2014  Chang et al.
8,796,666 B1    8/2014  Huang et al.
(Continued)

FOREIGN PATENT DOCUMENTS

| JP | 2003303764 | 10/2003 | |
|---|---|---|---|
| JP | 2005276473 | 10/2005 | |
| WO | WO-2018092227 A1 * | 5/2018 | ............... H05G 2/00 |

*Primary Examiner* — Colin W Kreutzer
(74) *Attorney, Agent, or Firm* — McClure, Qualey & Rodack, LLP

(57) ABSTRACT

A method for generating a radiation light in a lithography exposure system is provided. The method includes connecting a first nozzle assembly coupled to a support to an outlet of a storage member that receives a target fuel inside. The method further includes guiding the target fuel flowing through the first nozzle assembly and supplying a droplet of the target fuel into an excitation zone via the first nozzle assembly. The method also includes moving the support to connect a second nozzle assembly coupled to the support with the outlet. In addition, the method includes guiding the target fuel flowing through the second nozzle assembly and supplying a droplet of the target fuel into the excitation zone via the second nozzle assembly. The method further includes irradiating the droplet of the target fuel in the excitation zone with a laser pulse.

20 Claims, 8 Drawing Sheets

Related U.S. Application Data continuation of application No. 16/045,811, filed on Jul. 26, 2018, now Pat. No. 10,338,475.

(60) Provisional application No. 62/588,487, filed on Nov. 20, 2017.

(58) Field of Classification Search
USPC .................................................. 355/67, 77
See application file for complete search history.

(56) References Cited

U.S. PATENT DOCUMENTS

| | | |
|---|---|---|
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 10,338,475 B2 | 7/2019 | Chen et al. |
| 10,509,324 B2 * | 12/2019 | Chen .................... G03F 7/70008 |
| 2004/0159802 A1 | 8/2004 | Ziener et al. |
| 2013/0153792 A1 | 6/2013 | Baumgart et al. |
| 2015/0055106 A1 | 2/2015 | Dijksman et al. |
| 2015/0264791 A1 | 9/2015 | Nikipelov et al. |
| 2015/0268559 A1 | 9/2015 | Badie et al. |
| 2015/0323862 A1 | 11/2015 | Chang et al. |
| 2016/0116332 A1 | 4/2016 | Wu et al. |
| 2016/0377848 A1 | 12/2016 | Wu et al. |
| 2017/0019981 A1 | 1/2017 | Shen et al. |
| 2019/0271914 A1 * | 9/2019 | Nishisaka ................ H05G 2/00 |

* cited by examiner

LIGHT SOURCE FOR LITHOGRAPHY EXPOSURE PROCESS

PRIORITY CLAIM AND CROSS-REFERENCE

This application is a Continuation of application Ser. No. 16/449,645, filed on Jun. 24, 2019, now U.S. Pat. No. 10,509,324, which is a Continuation of application Ser. No. 16/045,811, filed on Jul. 26, 2018 (now U.S. Pat. No. 10,338,475, issued on Jul. 2, 2019), which claims the benefit of U.S. Provisional Application No. 62/588,487, filed on Nov. 20, 2017, the entirety of which are incorporated by reference herein

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser onto small fuel droplet targets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for generating EUV light have been adequate for their intended purposes, they have not been entirely satisfactory in all respects. Consequently, it would be desirable to provide a solution for increasing power conversion efficiency from the input energy for ionization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
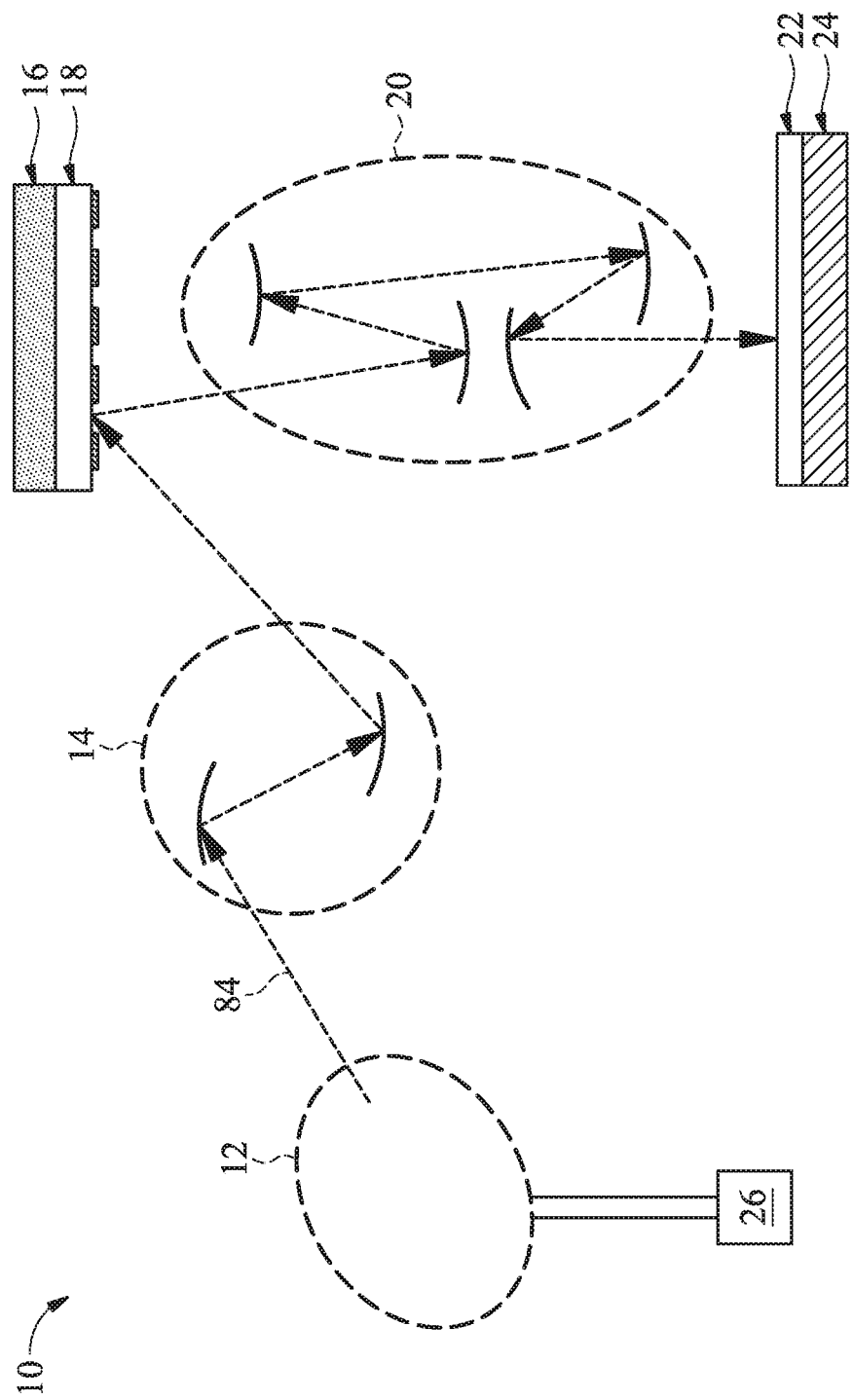
FIG. 1 is a schematic view of a lithography exposure system with a light source, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fabrication of fin-type field effect transistors (FinFETs). For example, the advanced lithography process of the present disclosure is well suited to produce a relatively closely-space features of FinFETs.

FIG. 1 is a schematic and diagrammatic view of a lithography exposure system 10, in accordance with some embodiments. The lithography exposure system 10 may also be generically referred to as a scanner that is operable to perform lithography exposing processes with respective radiation sources and exposure modes.

The lithography exposure system 10 includes a light source 12, an illuminator 14, a mask stage 16, a projection optics module (or projection optics box (POB)) 20 and a substrate stage 24, in accordance with some embodiments.

The elements of the lithography exposure system 10 can be added to or omitted, and the invention should not be limited by the embodiment.

The light source 12 is configured to generate radiation having a wavelength ranging between about 1 nm and about 100 nm. In one particular example, the light source 12 generates an EUV light with a wavelength centered at about 13.5 nm. Accordingly, the light source 12 is also referred to as an EUV light source. However, it should be appreciated that the light source 12 should not be limited to emitting EUV light. The light source 12 can be utilized to perform any high-intensity photon emission from excited target fuel.

In various embodiments, the illuminator 14 includes various refractive optic components, such as a single lens or a lens system having multiple lenses (zone plates) or alternatively reflective optics (for EUV lithography exposure system), such as a single mirror or a mirror system having multiple mirrors in order to direct light from the light source 12 onto the mask stage 16, particularly to a mask 18 secured on the mask stage 16. In the present embodiment where the light source 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography exposure system for the EUV lithography patterning is maintained in a vacuum environment to avoid EUV intensity loss. In the present disclosure, the terms mask, photomask, and reticle are used interchangeably.

In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The mask 18 may further include a capping layer, such as ruthenium (Ru), disposed on the reflective multilayer for protection. The mask 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or projection optics box (POB)) 20 is configured for imaging the pattern of the mask 18 on to a semiconductor wafer 22 secured on the substrate stage 24 of the lithography exposure system 10. In some embodiments, the POB 20 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 20. The illuminator 14 and the POB 20 are collectively referred to as an optical module of the lithography exposure system 10.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV light in the present embodiment. Various components including those described above are integrated together and are operable to perform lithography exposing processes.

The lithography exposure system 10 may further include other modules or be integrated with (or be coupled with) other modules. In the present embodiment, the lithography exposure system 10 includes a cleaning module 26 designed to provide hydrogen gas to the light source 12. The hydrogen gas helps reduce contamination in the light source 12.

Figure 2:
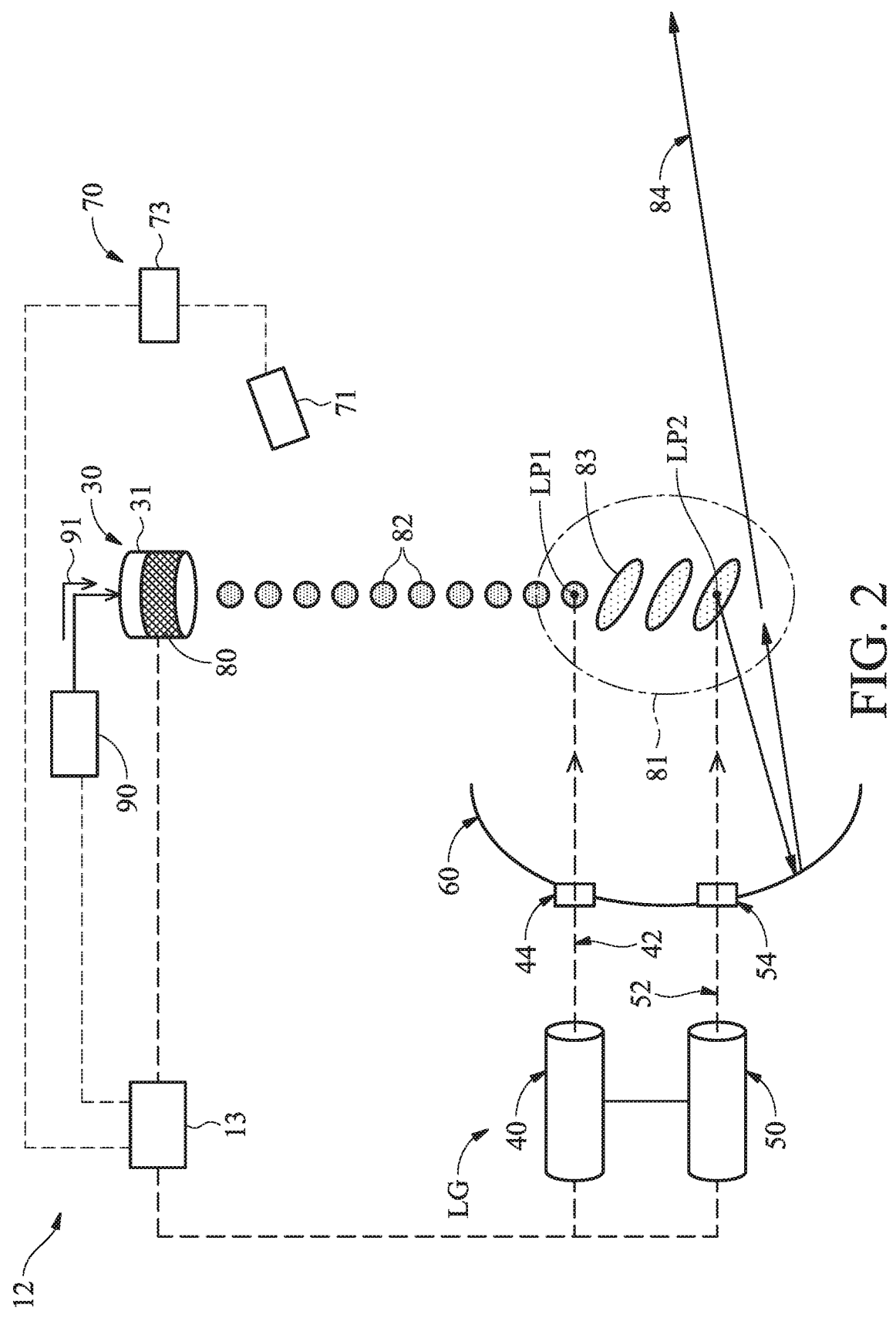
FIG. 2 is a schematic view of the light source in the lithography exposure system of FIG. 1, in accordance with some embodiments.

FIG. 2 illustrates the light source 12 in a diagrammatical view, in accordance with some embodiments. In some embodiments, the light source 12 employs a dual-pulse laser produced plasma (LPP) mechanism to generate plasma and further generate EUV light from the plasma. The light source 12 includes a controller 13, a target fuel generator 30, a laser generator LG, a laser produced plasma (LPP) collector 60, a monitoring device 70 and a gas-supply device 90. The above-mentioned elements of the light source 12 may be held under vacuum. It should be appreciated that the elements of the light source 12 can be added to or omitted, and the invention should not be limited by the embodiment.

The target fuel generator 30 is configured to generate a plurality of droplets 82 of a target fuel 80. In some embodiments, the target fuel generator 30 includes a storage member 31 for receiving a target fuel 80 and a gas-supply device 90. The gas-supply device 90 is connected to the storage member 31 and configured to supply a pumping gas 91 into the storage member 31. The pumping gas 91 increases the pressure in storage member 31 so as to force target fuel 80 contained in the storage member 31 out of the target fuel generator 30 in the form of droplets 82.

In some embodiments, a flow velocity of the droplets 82 from the target fuel generator 30 is a function of the pressure of the pumping gas 91 in the target fuel generator 30. For example, the droplets 82 flow faster when the pressure of the pumping gas 91 in the storage member 31 is increased, and the droplets 82 flow slower when the pressure of the pumping gas 91 in the storage member 31 is reduced. The structural feature of the target fuel generator 30 will be described in more details in relation to FIGS. 3 and 4.

In an embodiment, the target fuel 80 includes tin (Sn). In an embodiment, the droplets 82 each have a diameter about 30 microns (μm). In an embodiment, the droplets 82 are generated at a rate about 50 kilohertz (kHz) and are introduced into a zone of excitation 81 in the light source 12 at a speed about 70 meters per second (m/s). Other material can also be used for the target fuel 80, for example, a tin containing liquid material such as eutectic alloy containing tin, lithium (Li), and xenon (Xe). The target fuel 80 may be in a solid or liquid phase.

The laser generator LG is configured to generate at least one laser pulse to allow the conversion of the droplets 82 into plasma. In some embodiments, the laser generator LG includes a first laser source 40 and a second laser source 50. The first laser source 40 is configured to produce a pre-pulse laser 42. The second laser source 50 is configured to produce a main pulse laser 52. The pre-pulse laser 42 is used to heat (or pre-heat) the droplets 82 to expand the droplets 82, which is subsequently irradiated by the main pulse laser 52, generating increased emission of light. In an embodiment, the first laser source 40 is a carbon dioxide ($CO_2$) laser source. In another embodiment, the first laser source 40 is a neodymium-doped yttrium aluminum garnet (Nd:YAG) laser source. In an embodiment, the second laser source 50 is a $CO_2$ laser source.

In the present embodiment, the pre-pulse laser 42 has less intensity and a smaller spot size than the main pulse laser 52. In various embodiments, the pre-pulse laser 42 has a spot size of about 100 μm or less, and the main pulse laser 52 has a spot size about 200-300 μm, such as 225 μm. The pre-pulse laser 42 and the main pulse laser 52 are generated to have certain driving powers to fulfill wafer volume production, such as a throughput of 125 wafers per hour. For example, the pre-pulse laser 42 is equipped with about 2 kilowatts (kW) driving power, and the main pulse laser 52 is equipped with about 19 kW driving power. In various embodiments, the total driving power of the pre-pulse laser 42 and the main pulse laser 52, is at least 20 kW, such as 27 kW. However, it should be appreciated that many variations and modifications can be made to embodiments of the disclosure.

The pre-pulse laser 42 and main pulse laser 52 are directed through windows (or lenses) 44 and 54, respectively, into the zone of excitation 81 and irradiate droplets 82 at a first lighting position LP1 and a second lighting position LP2. The windows 44 and 54 adopt a suitable material substantially transparent to the respective lasers. The method for exciting the droplets 82 supplied by the target fuel generator 30 is described later.

The monitoring device 70 is configured to monitor the condition of the droplets 82 supplied by the target fuel generator 30. In some embodiments, the monitoring device 70 includes a droplet condition detector 71 and an analyzer 73. The droplet condition detector 71 may include an image sensor, such as charge coupled device (CCD) or complementary metal oxide semiconductor sensor (CMOS sensor), etc. The droplet condition detector 71 produces a monitoring image including image or video of the droplets 82 and transmits the monitoring image to the analyzer 73.

The analyzer 73 is configured to analyze signals produced by the droplet condition detector 71 and output a detection signal to the target fuel controller 13 according to an analyzing result. For example, the analyzer 73 includes an image analyzer. The analyzer 73 is in electrical communication with the droplet condition detector to receive the data associated with the images transmitted from the droplet condition detector 71 and performs an image-analysis process on the images of the droplets 82 in the excitation zone 81. Afterwards, the analyzer 73 sends data related to the analysis to the controller 13. The analysis may include error message such as a flow path error or a position error.

It should be appreciated that, while there is only one monitoring device 70 arranged for monitoring the droplets 82, many variations and modifications can be made to embodiments of the disclosure. In some other embodiments, there are two monitoring devices 70 used to monitor the droplets 82. One of the monitoring devices 70 is used to monitor the condition of the droplets 82 which have not been hit by the pre-pulse laser 42. The other monitoring device 70 is used to monitor droplets 82 that have been hit by the pre-pulse laser 42.

The controller 13 is configured to control one or more elements of the light source 12. In some embodiments, the controller 13 is configured to drive the target fuel generator 30 to generate the droplets 82 (a process that will be described in more detail in relation to the method S shown in FIG. 6). In addition, the controller 13 is configured to drive the first laser source 40 and the second laser source 50 to fire the pre-pulse laser 42 and the main pulse laser 52. The generation of the pre-pulse laser 42 and the main pulse laser 52 may be controlled to be associated with the generation of droplets 82 by the controller 13 so as to make the pre-pulse laser 42 and the main pulse laser 52 hit each droplet 82 in sequence.

The controller 13 may be a computer system. In one example, the computer system includes a network communications device or a network computing device (for example, a mobile cellular phone, a laptop, a personal computer, a network server, etc.) capable of communicating with a network. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM) or other static storage devices, for storing data and/or instructions to be executed by the processor. For example, the system memory component may store a predetermined value of a flow velocity of droplets, a predetermined value of the period of time during which an individual droplet passes two detection positions, or an acceptable range for adjusting parameter of the laser generator.

The target fuel generator 30 is discussed further below.

Figure 3:
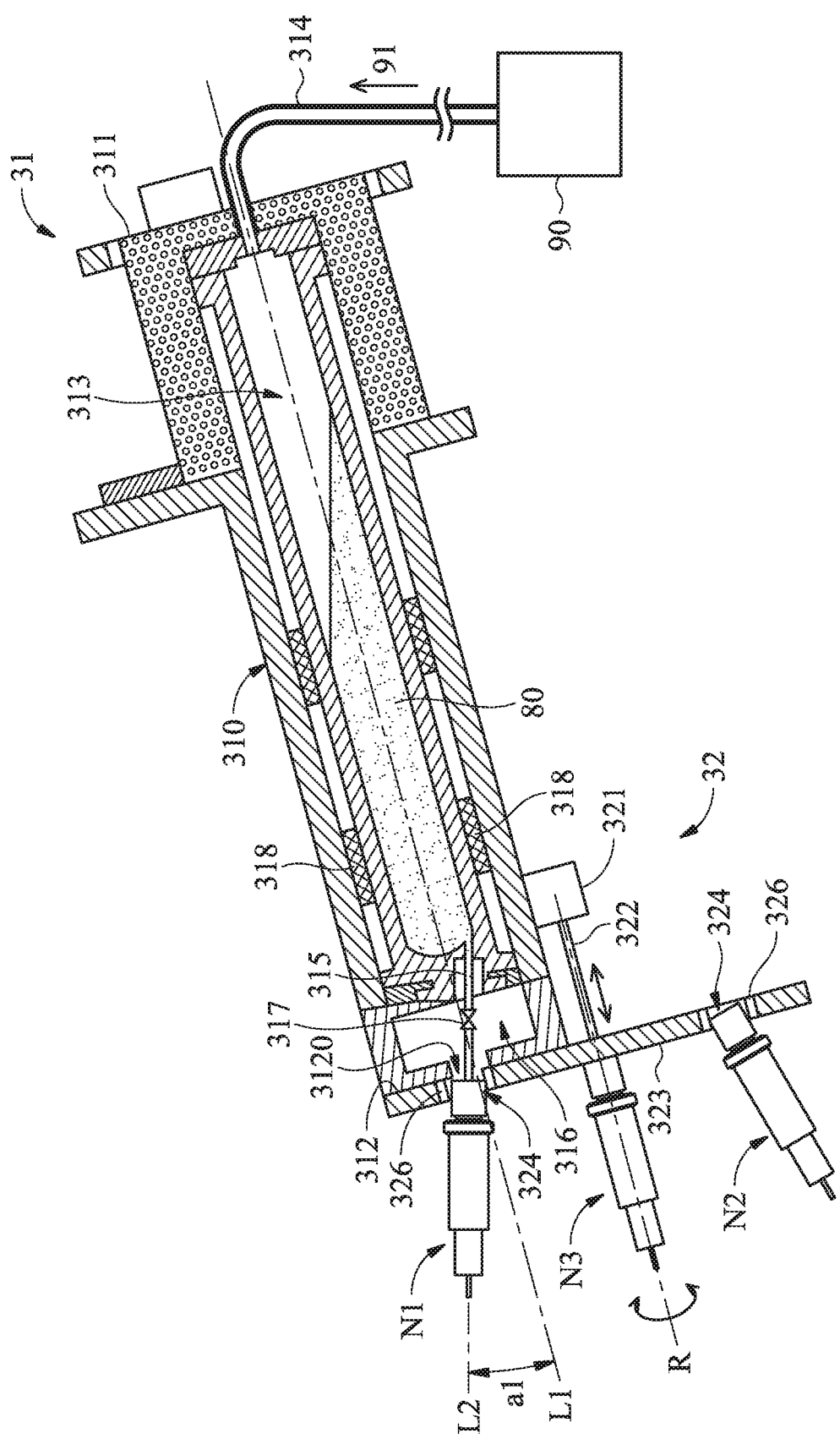
FIG. 3 is a cross-sectional view of partial elements of a target fuel generator in communication with a gas-supply device, in accordance with some embodiments.

FIG. 3 shows a schematic view of the target fuel generator 30 connected to the gas-supply device 90, in accordance with some embodiments. In some embodiments, the storage member 31 of the target fuel generator 30 includes a main body 310. The main body 310 extends along a first extending axis L1 from a first end 311 to a second end 312. A reservoir 313 is formed in the main body 310 and extends along the first extending axis L1. In addition, a gear space 316 is formed next to the second end 312 of the main body 310 and separate from the reservoir 313. An opening 3120 is formed on the second end 312 and communicates with the gear space 316.

The target fuel generator 30 further includes an inlet 314. The inlet 314 is connected to the first end 311 of the main body 310 and communicates with one end of the reservoir 313 that is adjacent to the first end 311. The inlet 314 may include a tube structure and be configured to allow the pumping gas 91 from the gas-supply device 90 to enter the reservoir 313, thereby forming a high pressure in the reservoir 313.

The target fuel generator 30 also includes an outlet 315 allowing the target fuel 80 in the reservoir 313 to discharge. In some embodiments, as shown in FIG. 3, a portion of the outlet 315 is located in the gear space 316 and communicates with the other end of the reservoir 313 that is adjacent to the second end 312. In addition, the other portion of the outlet 315 passes through the opening 3120 and is exposed by the opening 3120. In some embodiments, the outlet 315 extends along a second extending axis L2 that is not is not parallel with the first extending axis L1. An angle a1 formed between the first extending axis L1 and the second extending axis L2 is greater than zero. In one certain embodiment, the angle a1 is in a range from about 11.5 degrees to about 12.5 degrees.

In some embodiments, the storage member 31 of the target fuel generator 30 further includes a valve mechanism 317. The valve mechanism 317 is located in the gear space 316 and connected to the outlet 315. The valve mechanism 317 is configured to control the flow of the target fuel 80 in the outlet 315 according to a control signal issued by the controller 13 (FIG. 2). The valve mechanism 317 may be a proportional valve, such as an electric proportional valve. In some other embodiments, the valve mechanism 317 is omitted. The flow of the target fuel 80 in the outlet 315 is controlled by changing the pressure in the reservoir 313.

In some embodiments, the storage member 31 of the target fuel generator 30 further includes a number of heaters 318 connected to the main body 310. The heaters 318 are configured to heat up the target fuel 80 received in the reservoir. In some embodiments, the heaters 318 are electrically connected to the controller 13 (FIG. 2) and are operated in response to a control signal from the controller. The heaters 318 may be operated to heat the reservoir 313 at a temperature that is higher than a melting temperature, such as 250° C. to keep the target fuel in a liquid state.

In some embodiments, the target fuel generator 30 further includes a selection mechanism 32 and a number of nozzle assemblies, such as a first nozzle assembly N1, a second nozzle assembly N2 and a third nozzle assembly N3. It should be appreciated that the number of nozzle assemblies can vary to meet demand. In some embodiments, the number of nozzle assemblies is greater than 2.

In the embodiment shown in FIG. 3, the selection mechanism 32 is configured to support the first nozzle assembly N1, the second nozzle assembly N2 and the third nozzle assembly N3. In addition, the selection mechanism 32 is configured to selectively fluidly connect the outlet 315 with either the first nozzle assembly N1, the second nozzle assembly N2 or the third nozzle assembly N3 to enable the target fuel 80 to flow into the first nozzle assembly N1, the second nozzle assembly N2 or the third nozzle assembly N3 that is connected to the outlet 315.

In some embodiments, the selection mechanism 32 includes an actuator 321, a transmission rod 322 and a support 323. The actuator 321 is connected to the main body 310 of the storage member 31. The support 323 is connected to the actuator 321 via the transmission rod 322 and positioned next to the second end 312 of the main body 310.

The actuator 321 is configured to drive the movement of the support 323 via the transmission rod 322. For example, the actuator 321 is configured to drive the support 323 to rotate about a rotation axis R. The rotation axis R may be parallel with the first extending axis L1 and distant from the first extending axis L1. The rotation axis R does not overlap the first extending axis L1. Alternatively or additionally, the actuator 321 is configured to drive the support 323 to move in a direction that is parallel to the first extending axis L1. As a result, the support 323 can be moved to abut against the second end 312 of the main body 310 or to be disengaged from the second end 312 of the main body 310.

In some embodiments, the actuator 321 is electrically connected to the controller 13 and move the support 323 according to a control signal transmitted from the controller 13 (FIG. 2). The actuator 321 may be any motor that can drive the movement of the support 323. For example, the actuator 321 includes a DC motor, a step motor or other suitable driving elements. In some embodiments, the actuator 321 is omitted. The support 323 is moved manually.

Figure 4:
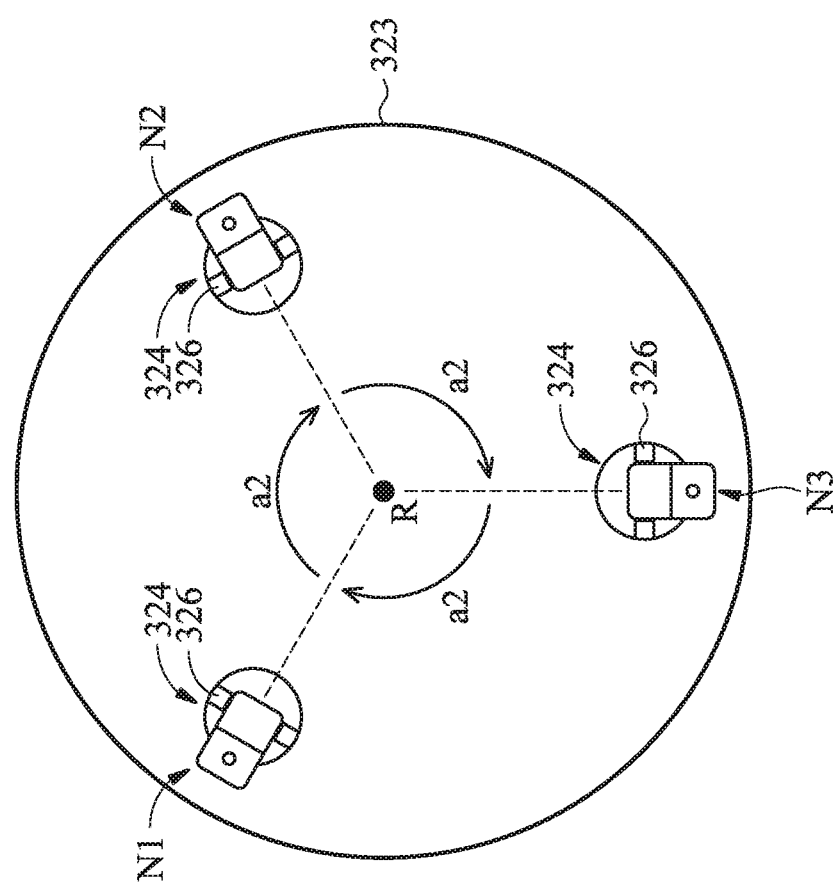
FIG. 4 is a side view of partial elements of a target fuel generator, in accordance with some embodiments.

In some embodiments, as shown in FIG. 4, the support 323 has a circular shape and includes a number of through hole 324 penetrates therethrough. For example, in cases where there are three nozzle assemblies N1, N2 and N3 are coupled to the support 323, three through holes 324 are formed on the support 323. The first nozzle assembly N1, the second nozzle assembly N2 and the third nozzle assembly N3 are positioned in the three through holes 324. The through holes 324 may be configured to have a shape that is compatible with the connection portion of the first nozzle assembly N1, the second nozzle assembly N2 and the third nozzle assembly N3. Therefore, the first nozzle assembly N1, the second nozzle assembly N2 and the third nozzle assembly N3 are a tight fit when connected to the through holes 324.

Alternatively, the selection mechanism 32 further includes a number of fastening elements 326 configured to fasten the first nozzle assembly N1, the second nozzle assembly N2 and the third nozzle assembly N3 to the support 323. For example, the selection mechanism 32 includes three fastening elements 326 positioned in the through holes 324. The selection mechanism 32 can be driven by the controller 13 (FIG. 2) to tightly clench the first nozzle assembly N1, the second nozzle assembly N2 and the third nozzle assembly N3. In some embodiments, the fastening elements 326 is configured to rotate a nut 37 (which will be described in detail later) to facilitate an engagement of the nozzle assemblies N1, N2 and N3 with the outlet 315.

In some embodiments, the first nozzle assembly N1, the second nozzle assembly N2 and the third nozzle assembly N3 are spaced apart from each other by an angle a2 in a circumference direction of the support 323. The angle a2 may satisfy the equation: a2=360°/n, wherein n is the numbers of the nozzles assembly. In the embodiments, the angle a2 between the first nozzle assembly N1, the second nozzle assembly N2 and the third nozzle assembly N3 is about 120 degrees.

Figure 5:
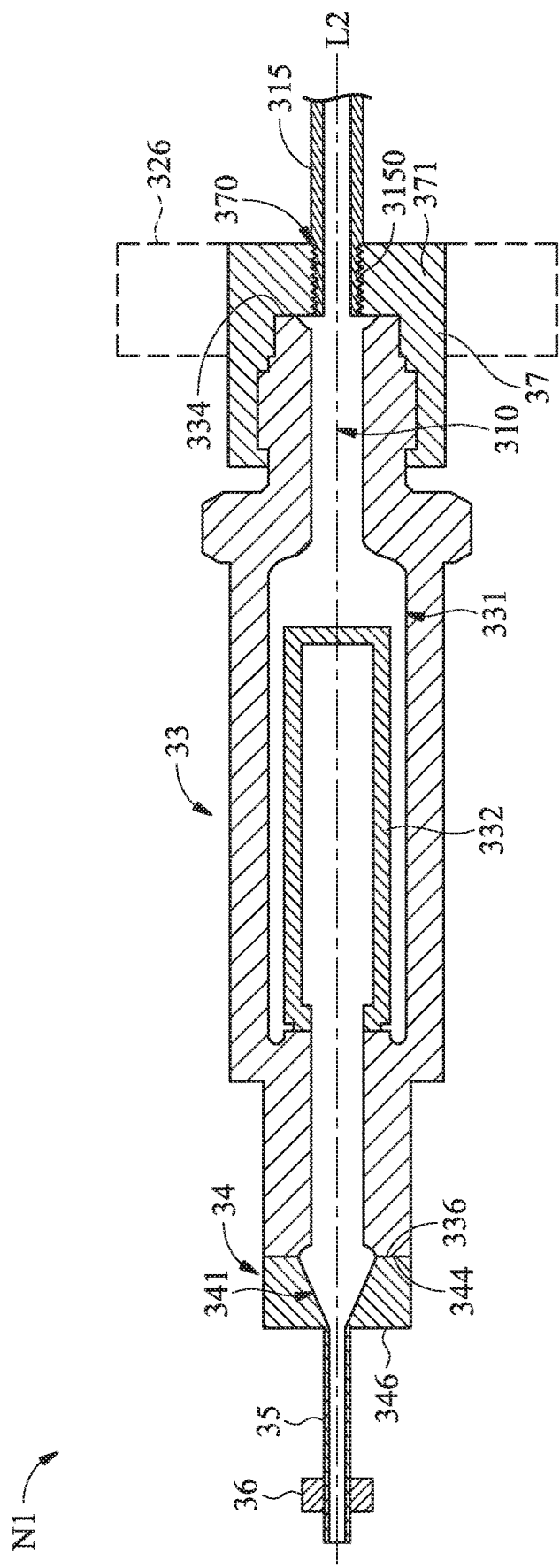
FIG. 5 is a cross-sectional view of a first nozzle assembly connected to an outlet, in accordance with some embodiments.

FIG. 5 shows a cross-sectional view of the first nozzle assembly N1 connected to the outlet 315, in accordance with some embodiments. In some embodiments, the first nozzle assembly N1 includes a filter 33, a connection element 34, a nozzle head 35, a droplet actuating element 36, and a nut 37.

The filter 33 is configured to remove impurities in the target fuel 80 from the storage member 31. In some embodiments, the filter 33 extends along the second extending axis L2 and a filter channel 331 is formed in the filter 33. An opening of the filter channel 331 is located at an end portion 334 that connects to the support 323 (FIG. 3), and the other opening of the filter channel 331 is located at an end portion 336 that connects to the connection element 34. In some embodiments, a porous membrane 332 is positioned in the filter channel 331 to remove impurities. In some embodiments, in a plane that is parallel to the second extending axis L2, the porous membrane 332 has a substantially U-shape cross-section so as to improve the filtering efficiency.

The connection element 34 is connected to the end portion 336 of the filter 33. A connection channel 341 formed in the connection element 34. An opening of the connection channel 341 is located at an end portion 344 of the connection element 34 that connects to the filter 33 to receive the target fuel 80 (FIG. 3) from the filter 33. In addition, the other opening of the connection channel 341 is located at an end portion 346 of the connection element 34 that connects to the nozzle head 35 to supply the target fuel 80 (FIG. 3) into the nozzle head 35.

In some embodiments, in a direction away from the filter 33, the width of the connection channel 341 decreases gradually. For example, in a plane that is parallel to the second extending axis L2, the connection channel 341 has a tapered cross-section. The width of the opening the connection channel 341 which is formed on the end portion 346 may be equal to or slightly greater than the width of the nozzle head 35 for facilitating the target fuel 80 entering the nozzle head 35 without causing too much pressure over the nozzle head 35.

Still referring FIG. 5, in some embodiments, the nozzle head 35 has a tube structure. The nozzle head 35 extends in the second extending axis L2 and is connected to the connection element 34. The droplet actuating element 36 surrounds the nozzle head 35. The droplet actuating element 36 may include a piezoelectric material and is electrically connected to the controller 13 (FIG. 2). The droplet actuating element 36 produces a compressing pressure over the nozzle head 35 according to a control signal issued by the controller 13 so as to eject the droplets 82 (FIG. 2) from the nozzle head 35 with a predetermined mode.

For example, the controller 13 supplies a voltage to the actuator 36 at a given frequency, causing the droplet actuating element 36 to press the nozzle head 35 at the time of receiving the voltage and stop the pressing when no voltage is received. As a result, the nozzle head 35 may supply a plurality of droplets 82 in the form of micro-droplets into the excitation zone 81 (FIG. 2). In some other embodiments, a droplet pitch between two neighboring droplets 82 and/or the diameter of the droplets 82 are controlled as a function of the frequency at which the voltage is supplied to the actuator 36.

In some embodiments, the filter 33 and the outlet 315 are engaged with each other through the nut 37. The nut 37 is connected to the first end 334 of the filter 33 and having a nut channel 370. The nut channel 370 is aligned with the filter channel 331. An internal thread 3150 may be formed on an inner surface of the nut channel 370 for engagement with an external thread formed on the outlet 315. To fluidly connect the outlet 315 with the filter 33, the outlet 315 is inserted into the nut channel 370 and the outlet 315 is affixed to the nut 371 via a threaded engagement. In case where the fastening elements 326 is utilized to fasten the nozzle assembly N1, the nut 371 is clenched by the fastening elements 326 when the nozzle assembly N1 is inserted into the through hole 324 (FIG. 3). In addition, the nut 371 is driven to rotate by the fastening elements 326 to be threaded into the outlet 315.

In some embodiments, the structural features of the second nozzle assembly N2 and the third nozzle assembly N3 may be the same or similar to the arrangement of the first nozzle assembly N1, and the features thereof are not repeated in the interest of brevity.

Figure 6:
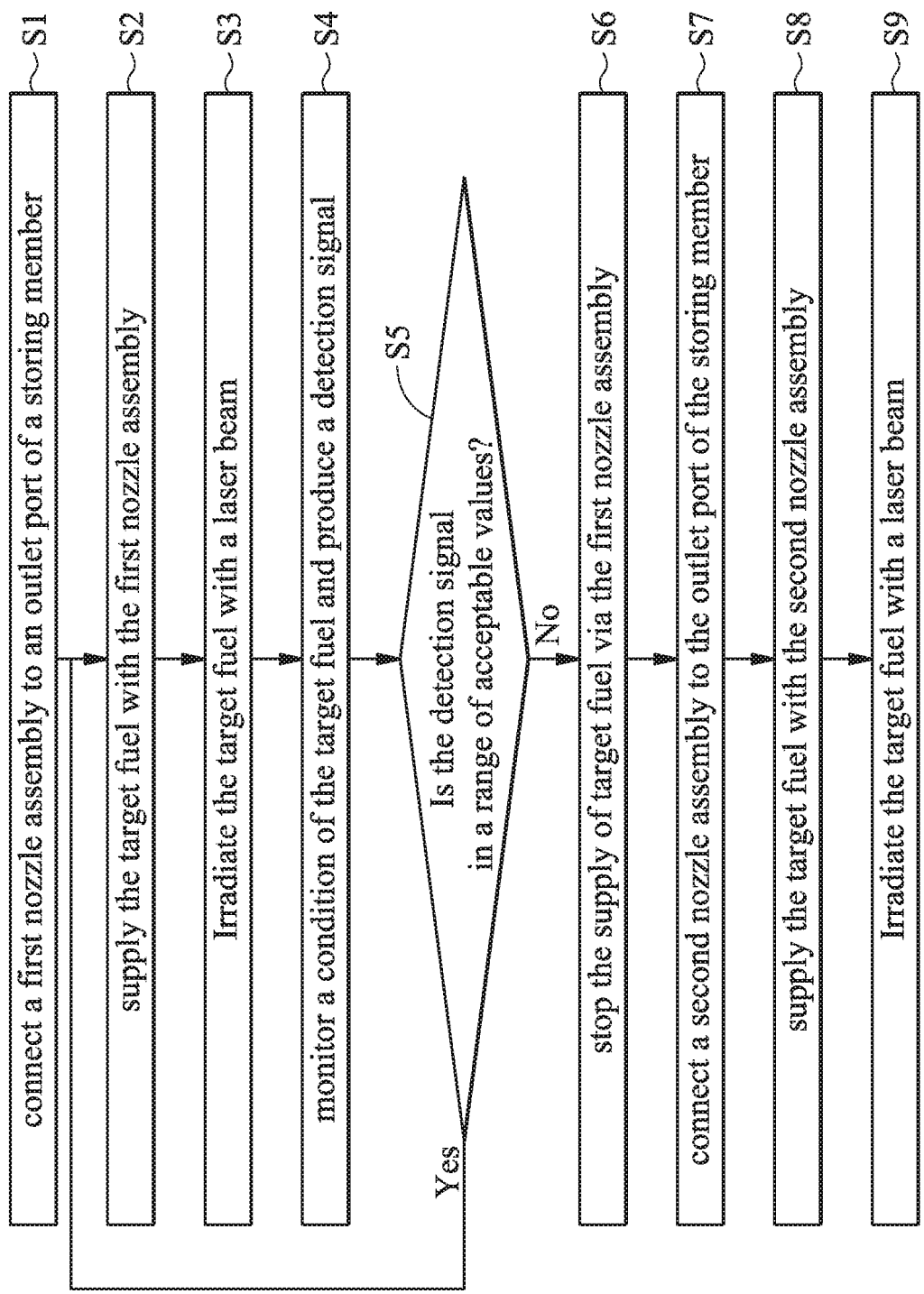
FIG. 6 is a flowchart of a method for generating a radiation light in a lithography exposure system, in accordance with some embodiments.

FIG. 6 is a flowchart of a method S for generating a radiation light in a lithography exposure system, in accordance with some embodiments. For illustration, the flow chart will be described along with the drawings shown in FIGS. 1-5 and 7-8. Some of the described stages can be replaced or eliminated in different embodiments.

The method S includes operation S1, in which the first nozzle assembly N1 is connected to the outlet 315 of the storage member 31. In some embodiments, as shown in FIG. 3, the support 323 of the selection mechanism 32 is positioned at a first angle of rotation (first position). At the first angle of rotation, the first nozzle assembly N1 is fluidly connected to the outlet 315 of the storage member 31. In contrast, the other nozzle assemblies positioned on the support 323, such as the second nozzle assembly N2 and the third nozzle assembly N3 are disengaged from the outlet 315.

The method S also includes operation S2, in which the target fuel 80 from the storage member 31 is supplied by the first nozzle assembly N1. In some embodiments, after the operation S1, the pumping gas 91 is pumped into the reservoir 313 via the inlet 314 to force the target fuel 80 received in the reservoir 313 out of the storage member 31 via the outlet 315 and drive the flowing of the target fuel 80 in the first nozzle assembly N1.

After the target fuel 80 enters the first nozzle assembly N1, the droplet actuating element 36 changes the force applied on the nozzle head 35 in response to control signal issued by the controller 13, so as to convert the target fuel 80 into the droplets 82 with predetermined mode.

The method S also includes operation S3, in which one or more lasers are irradiated over the droplets 82 of target fuel 80. In some embodiments, as shown in FIG. 2, the first laser source 40 is used to generate the pre-pulse laser 42 to expand the gaseous material in the droplets 82 before the main pulse laser 52 irradiates the droplets 82.

Specifically, before being irradiated by the pre-pulse laser 42, the droplets 82 have a circular shape. Afterwards, when the droplets 82 are irradiated by the pre-pulse laser 42, a portion of the pre-pulse laser 42 is converted to kinetic energy to transform the droplets 82 to pancake-shaped target mists 83, as shown in FIG. 2. Afterwards, the second laser source 50 is used to generate the main pulse laser 52 to excite the target material 80 in the droplets 82. Specifically, the main pulse laser 52 heats the target material 80 in the droplets 82 to a critical temperature. At the critical temperature, the target material 80 in the droplets 82 is excited to plasma and emits EUV light 84. The lithography exposure system 10 uses the EUV light 84 to perform a lithography exposure process over a semiconductor wafer 22.

The method S also includes operation S4, in which at least one condition of the droplets 82 of the target fuel 80 is monitored and a detection signal is produced according to the monitoring result. In some embodiments, operation S4 is performed by the monitoring device 70. The droplet condition detector 71 of the monitoring device 70 produces an image or a video of the droplets 82 of the target fuel 80 and transmits data associated with the images or video to the analyzer 72. The analyzer 72 analyzes the image or the video and produces a detection signal to the controller 13. For example, the analyzer 72 compares the image or the video from the droplet condition detector 71 with a reference image or a reference video to calculate a deflection distance of each of the droplets 82, and produce a detection signal to the controller 13 according to the calculated deflection distance.

It should be appreciated that while in the above-mentioned embodiments, the deflection distance of each of the droplets 82 is monitored, the disclosure should not be limited thereto. Other characteristics of the droplets 82 of the target fuel 80, such as the velocity of the droplets 82, the size of the droplets 82, or the distance between two neighboring droplets 82, can be analyzed to determine if the target fuel generator 30 is operating normally.

The method S also includes operation S5, in which the detection signal is analyzed to determine if the detection signal is in a range of acceptable values. In some embodiments, the range of acceptable values for the detection signal may be a specific value from 0. For example, an upper limit of the range is set at 0 plus one specific value, and a lower limit of the range is set at 0 minus one specific value. The difference between the upper limit and the lower limit is referred to as the range of acceptable values.

In some embodiments, when the detection signal is in the range of acceptable values, the method S repeats operations S2-S5 until the end of the lithography exposure process; otherwise, the method S continues with operations S6-S9 to change the nozzle assembly that supplies the target fuel 80.

In operation S6, the supply of the target fuel 80 via the first nozzle assembly N1 is stopped. In some embodiments, to stop the supply of the target fuel 80, the controller 13 issues a control signal to the gas-supply device 90 to stop the supply of pumping gas 91 into the reservoir 313 to decrease the pressure in the reservoir 313 to below a predetermined value. The predetermined value may be a lower pressure limit to force the target fuel 80 out of the reservoir 313. When the reservoir 313 is below the decreased pressure, the flow of the target fuel 80 in the outlet 315 stops.

In other embodiments, to stop the supply of the target fuel 80, the controller 13 issues a control signal to the heaters 318 to decrease the temperate in the reservoir 313 below a predetermined value. The predetermined value may be a melting temperature of the target fuel 80. When the reservoir 313 is below the decreased temperature, the target fuel 80 is condensed into a solid state.

In other embodiments, to stop the supply of the target fuel 80, the controller 13 issues a control signal to the valve mechanism 317 to stop the flow of the target fuel 80 in the outlet 315. In some embodiments, the valve mechanism 317 is turned off after the pressure and the temperature are decreased to prevent damage to the valve mechanism 317.

In operation S7, the second nozzle assembly N2 is connected to the outlet 315 of the storage member 31. In some embodiments, before operation S7, the outlet 315 is disengaged from the first nozzle assembly N1. The method for disengaging the outlet 315 from the first nozzle assembly N1 may include actuating the fastening element 326 to release the outlet 315 from the nut 37. In addition, the method for disengaging the outlet 315 from the first nozzle assembly N1 may further include actuating the actuator 321 to move the transmission rod 322 from a first position (FIG. 3) to a second position (FIG. 7). in the direction indicated by the arrow D1 shown in FIG. 7. At the second position, the first nozzle assembly N1 is located away from the outlet 315. As a result, none of the nozzle assemblies N1, N2 and N3 engages the outlet 315.

Figure 7:
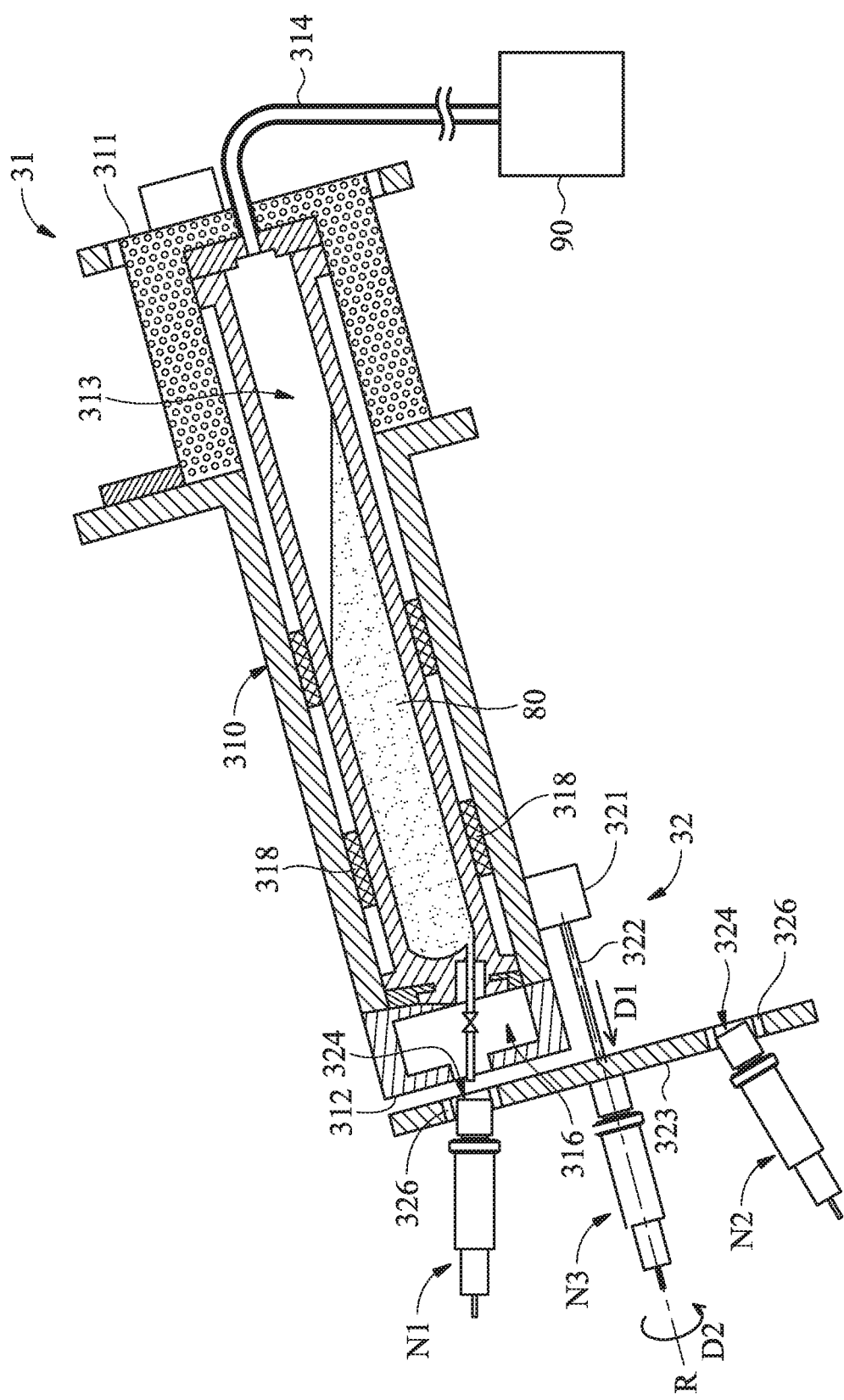
FIG. 7 is a cross-sectional view of partial elements of a target fuel generator as a first nozzle assembly is disengaged from an outlet of a storage member, in accordance with some embodiments.

After the outlet 315 is disengaged from the first nozzle assembly N1, the controller 13 issues a control signal to the actuator 321 to rotate the support 323 a predetermined angle in the direction indicated by the arrow D2 shown in FIG. 7 to angle the support 323 at a second angle of rotation. The predetermined angle of rotation may be equal to the angle a2 between the first nozzle assembly N1 and the second nozzle assembly N2.

Figure 8:
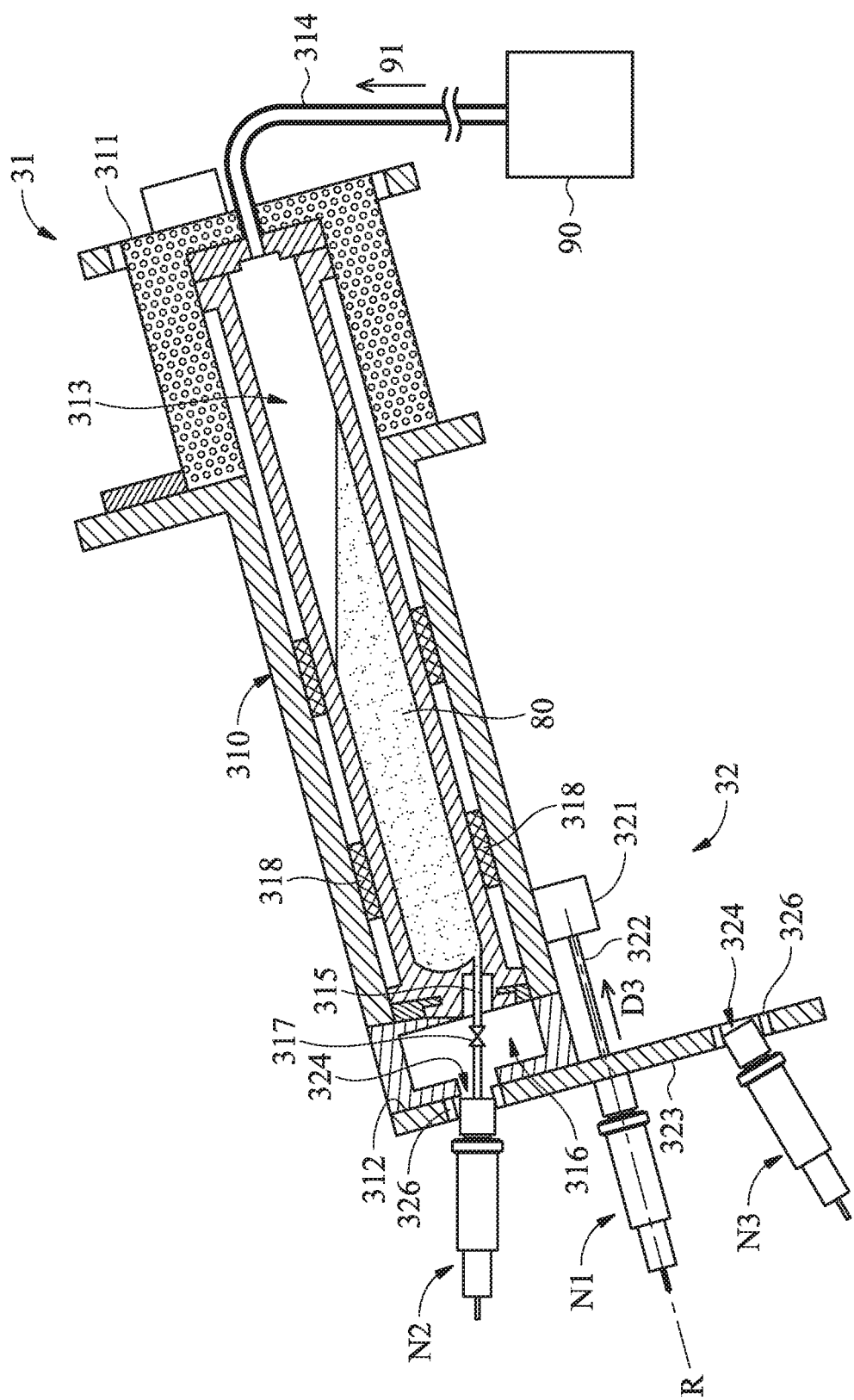
FIG. 8 is a cross-sectional view of partial elements of a target fuel generator as a second nozzle assembly is engaged with an outlet of a storage member, in accordance with some embodiments.

After being rotated the predetermined angle, the support 323 is moved toward the storage member 31 as indicated by the arrow D3 shown in FIG. 8, to bring the outlet 315 into contact with the nut 37 of the second nozzle assembly N2. Afterwards, the fastening element 326 may be actuated to fix the outlet 315 with the nut 37 (FIG. 5) of the second nozzle assembly N2. As a result, the second nozzle assembly N2 is fluidly connected with the outlet 315. In contrast, the first nozzle assembly N1 and the third nozzle assembly N3 are disengaged from the outlet 315.

In operation S8, the target fuel 80 from the storage member 31 is supplied by the second nozzle assembly N2. In some embodiments, the pumping gas 91 is pumped into the reservoir 313 via the inlet 314 to increase the pressure in the reservoir 313 higher than a predetermined pressure at which the target fuel 80 received in the reservoir 313 is forced out of the storage member 31 via the outlet 105 and flew into the second nozzle assembly N2.

In some embodiments, before operation S8 is performed, the heaters 318 are used to heat up the reservoir 313 to a temperature that is higher than the melting temperature of the target droplet 38 to convert the target droplet 38 into a liquid state. In addition, the valve mechanism 317 is turned on to enable the flow of the target fuel 80 in the outlet 315.

After the target fuel 80 enters the second nozzle assembly N2, the droplet actuating element 36 of the second nozzle assembly N2 changes the force applied on the nozzle head 35 of the second nozzle assembly N2 to convert the target fuel 80 into the droplets 82 with predetermined mode. In operation S9, one or more lasers are irradiated over the droplets 82 of target fuel 80 to excite the target material 80 in the droplets 82 to plasma and emits EUV light 84. In some embodiments, operations S8 and S9 are similar to operation S2 and S3, and details thereof are not repeated in the interest of brevity.

During operations S8 and S9, another operation similar with operations S4 and S5 are conducted to monitor the condition of the droplets 82 supplied by the second nozzle assembly N2. When the condition of the droplets 82 supplied by the second nozzle assembly N2 is outside the range of acceptable values, another nozzle assembly, such as third nozzle assembly N3 is used to supply droplets 82 in the following lithography exposure process.

In some embodiments, after the first nozzle assembly N1 is used for a period, impurities of the target fuel 80 may be clogged in the first nozzle assembly N1, and the first nozzle assembly N1 cannot be used again. Therefore, the method S may further include replacing the used first nozzle assembly N1 with a new nozzle assembly. The replacement of the first nozzle assembly N1 may be conducted manually, or it may be conducted automatically by a robotic arm (not shown in figures) located in the lithography exposure system.

Embodiments of a method for generating a radiation light in a lithography exposure process are provided. The target fuel generator stably supplies the target fuel according to the preset parameters by changing the nozzle assembly when the supply of the target fuel is abnormal. Since the target fuel generator can stably supply the target fuel, each droplet of the target fuel can be excited by the laser and emit the radiation light to expose the photoresist formed on the semiconductor wafer. As a result, the product yield of the semiconductor wafer is improved. On the other hand, the throughput of the lithography exposure system is increased because the lithography exposure system does not require frequent downtime for maintenance or repair.

In accordance with some embodiments, a lithography exposure system is provided. The lithography exposure system includes a selection mechanism. The lithography exposure system further includes a number of nozzle assemblies coupled to the selection mechanism and each configured to eject a droplet of a target fuel. The lithography exposure system also includes a storage member configured to store the target fuel and having an outlet. The selection mechanism is configured to selectively and fluidly connect the outlet with one of the nozzle assemblies to enable the target fuel to be supplied from the storage member via the outlet to the one of the plurality of nozzle assemblies that connected with the outlet. In addition, the lithography exposure system includes a laser generator configured to generate a laser pulse to hit the droplet.

In accordance with some embodiments, a lithography exposure system is provided. The lithography exposure system includes a target fuel generator. The a target fuel generator includes a storage member, a support, a first nozzle assembly and a second nozzle assembly. The storage member is configured to store a target fuel and having an outlet for allowing the target fuel to flow out of the storage member. The support is rotatably connected to the storage member. The first nozzle assembly and the second nozzle assembly are coupled to the support. Each of the first nozzle assembly and the second nozzle assembly is configured to eject a droplet of the target fuel. The lithography exposure system further includes a laser generator configured to generate a laser pulse to hit the target fuel supplied by the target fuel generator. When the support is at a first angle of rotation relative to the storage member, the first nozzle assembly is fluidly connected to the outlet to supply the droplet of the target fuel, and the second nozzle assembly is disengaged from the outlet. When the support is at a second angle of rotation relative to the storage member, the second nozzle assembly is fluidly connected to the outlet to supply the droplet of the target fuel, and the first nozzle assembly is disengaged from the outlet.

In accordance with some embodiments, a method for generating a radiation light in a lithography exposure system is provided. The method includes connecting a first nozzle assembly coupled to a support to an outlet of a storage member that receives a target fuel inside. The method further includes guiding the target fuel flowing through the first nozzle assembly and supplying a droplet of the target fuel into an excitation zone via the first nozzle assembly. The method also includes moving the support to connect a second nozzle assembly coupled to the support with the outlet. In addition, the method includes guiding the target fuel flowing through the second nozzle assembly and supplying a droplet of the target fuel into the excitation zone via the second nozzle assembly. The method further includes irradiating the droplet of the target fuel in the excitation zone with a laser pulse.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A target fuel generator, comprising:
    a storage member configured to store a target fuel; and
    a plurality of nozzle assemblies selectively and fluidly connected to an outlet of the storage member.

2. The target fuel generator as claimed in claim 1, wherein the storage member further comprises a valve mechanism connected to the outlet and configured to control flow of target fuel in the outlet.

3. The target fuel generator as claimed in claim 1, wherein the storage member extends along a first extending axis, and the one of the plurality of nozzle assemblies connected with the outlet extends along a second extending axis not parallel to the first extending axis.

4. The target fuel generator as claimed in claim 1, further comprising a selection mechanism configured to selectively and fluidly connect the outlet of the storage member with one of the plurality of nozzle assemblies so as to eject a droplet of the target fuel via the one of the plurality of nozzle assemblies that connected with the outlet, wherein the selection mechanism comprises:
    a support, wherein the plurality of nozzle assemblies is coupled to the support and arranged around a rotation axis; and
    an actuator connected to the support and configured to rotate the support about the rotation axis so as to selectively connect one of the plurality of nozzle assemblies with the outlet.

5. The target fuel generator as claimed in claim 1, further comprising a gas- supply device connected to an inlet of the storage member and configured to adjust pressure in the storage member.

6. The target fuel generator as claimed in claim 1, wherein the storage member further comprises a heating member configured to adjust temperature in the storage member.

7. The lithography exposure system as claimed in claim 4, wherein the selection mechanism is configured to move between a first position where one of the nozzle assemblies engages the outlet and a second position where none of the plurality of nozzle assemblies engages the outlet.

8. A target fuel generator, comprising:
    a first nozzle assembly and a second nozzle assembly; and
    a support disposed between the first and second nozzle assemblies and a storage member configured to store a target fuel, wherein the support is configured to move between a first position where the first nozzle assembly engages an outlet of the storage member and a second position where the second nozzle assembly engages the outlet.

9. The target fuel generator as claimed in claim 8, wherein the storage member further comprises a valve mechanism connected to the outlet and configured to control a flow of the target fuel in the outlet.

10. The target fuel generator as claimed in claim 8, wherein the storage member extends along a first extending axis, and the first nozzle assembly or the second nozzle assembly connected with the outlet extends along a second extending axis not parallel to the first extending axis.

11. The target fuel generator as claimed in claim 8, wherein the first nozzle assembly and the second nozzle assembly are coupled to the support in a detachable manner.

12. The target fuel generator as claimed in claim 8, wherein when the support is at the first position relative to the storage member, the first nozzle assembly is fluidly connected to the outlet to supply a droplet of the target fuel, and the second nozzle assembly is disengaged from the outlet;

wherein when the support is at the second position relative to the storage member, the second nozzle assembly is fluidly connected to the outlet to supply a droplet of the target fuel, and the first nozzle assembly is disengaged from the outlet.

13. A method for generating droplets of a target fuel in a lithography exposure system, comprising:

connecting a first nozzle assembly to an outlet of a storage member that receives the target fuel inside;

supplying a droplet of the target fuel into an excitation zone of the lithography exposure system via the first nozzle assembly;

connecting a second nozzle assembly with the outlet after the first nozzle assembly is disengaged from the outlet; and supplying a droplet of the target fuel into the excitation zone via the second nozzle assembly;

wherein the disconnecting of the first nozzle assembly from the outlet and the connecting of the second nozzle assembly with the outlet are performed while the lithography exposure system does not shut down.

14. The method as claimed in claimed 13, further comprising stopping the supply of the droplet of the target fuel via the first nozzle assembly by terminating the flow of the target fuel out of the storage member with a valve mechanism.

15. The method as claimed in claimed 13, further comprising guiding the flow of the target fuel in the first nozzle assembly in a second extending axis that is not parallel with a first extending axis along which the storage member extends.

16. The method as claimed in claimed 13, further comprising:

generating an image of the droplet;

performing an analysis of the image of the droplet and producing a detection signal according to the analysis of the image of the droplet; and stopping the supply of the target fuel via the first nozzle assembly when the detection signal is outside a range of acceptable values.

17. The method as claimed in claimed 16, wherein the image of the droplet is generated when the droplet is in the excitation zone.

18. The method as claimed in claimed 13, further comprising:

keeping the pressure of the storage member at a predetermined value for facilitating the supply of the target fuel into the first nozzle assembly; and decreasing the pressure of the storage member below the predetermined value before the first nozzle assembly is disengaged from the outlet.

19. The method as claimed in claimed 13, further comprising:

keeping the temperature of the storage member at a predetermined value for facilitating the supply of the target fuel into the first nozzle assembly; and decreasing the temperature of the storage member below the predetermined value before the first nozzle assembly is disengaged from the outlet.

20. The method as claimed in claimed 13, further comprising replacing the first nozzle assembly with another new nozzle assembly after the first nozzle assembly is disengaged from the storage member.

* * * * *